United States Patent [19]

Gschwendtner et al.

[11] 4,342,928
[45] Aug. 3, 1982

[54] CIRCUIT AND METHOD FOR VOLTAGE LEVEL CONVERSION

[75] Inventors: Jörg Gschwendtner, Esslingen; Wolfdieter Löhlein, Herrenberg, both of Fed. Rep. of Germany

[73] Assignee: International Business Machines Corporation, Armonk, N.Y.

[21] Appl. No.: 166,206

[22] Filed: Jul. 7, 1980

[30] Foreign Application Priority Data

Jul. 20, 1979 [DE] Fed. Rep. of Germany ....... 2929383

[51] Int. Cl.³ ...................... H03K 6/02; H03K 19/017
[52] U.S. Cl. ................................... 307/475; 307/264; 307/482
[58] Field of Search ............... 307/264, 448, 475, 482, 307/573, 578, 268

[56] References Cited

U.S. PATENT DOCUMENTS

| | | | |
|---|---|---|---|
| 3,708,689 | 1/1973 | Lattin | 307/475 |
| 3,710,271 | 1/1973 | Putnam | 307/482 |
| 3,739,194 | 6/1973 | Freeman et al. | 307/475 |
| 3,900,746 | 8/1975 | Kraft et al. | 307/475 |
| 4,063,119 | 12/1977 | Odell et al. | 307/290 |
| 4,264,829 | 4/1981 | Misaizu | 307/475 |

OTHER PUBLICATIONS

E. Arai et al., "A 64-Kbit Dynamic MOS RAM", IEEE Journal of Solid-State Circuits, vol. SC-13, No. 3, Jun., 1978, pp. 333-338.

Primary Examiner—John Zazworsky
Attorney, Agent, or Firm—Howard J. Walter, Jr.

[57] ABSTRACT

A known FET driver circuit which is to be controlled at the gate by means of relatively low TTL signals, is improved in such a manner that the source potential of the input transistors is shifted oppositely to the input signal. This leads to an increase in the effective potential difference in the signal level applied to the input transistors and thus to an improved switching speed.

8 Claims, 1 Drawing Figure

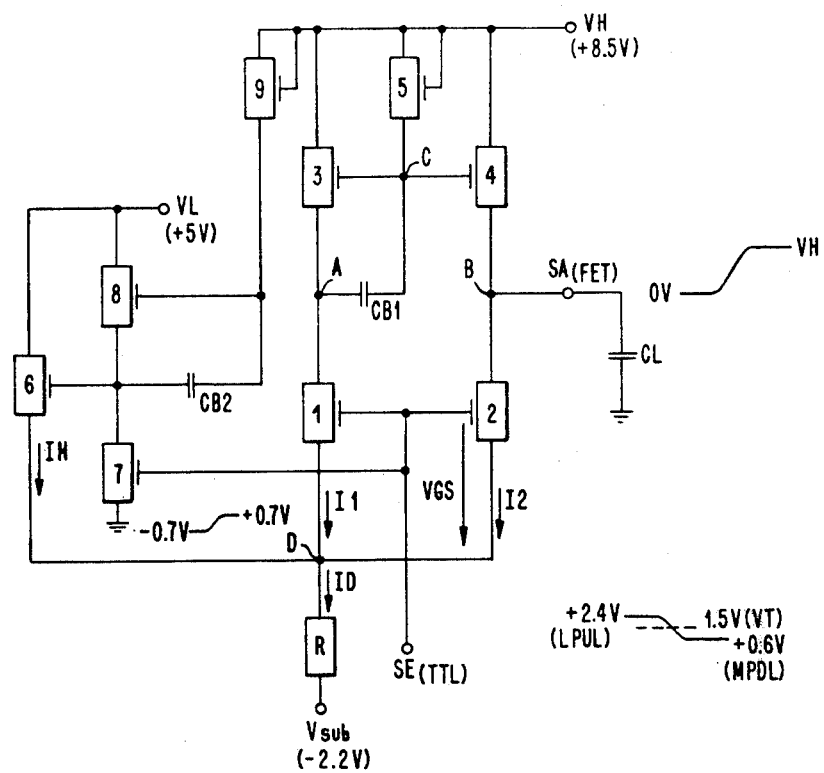

CIRCUIT AND METHOD FOR VOLTAGE LEVEL CONVERSION

BACKGROUND OF THE INVENTION

1. Field of the Invention

The invention concerns a circuit arrangement with field-effect transistors for voltage level converting a TTL input signal into higher FET levels relative thereto. The invention is primarily suitable for integrated semiconductor storage components of data processing systems.

2. Description of the Prior Art

The integrated semiconductor storage systems used in present-day processors are mainly in FET technology. However, because of their higher switching speed, such data processors also use integrated circuits in bipolar technology at a number of points for example, for high-speed registers, logic means, etc. To ensure that a complex circuit network made up of bipolar and field-effect components functions satisfactorily, it is of course, necessary to observe the operating and control voltage levels required. As in typical cases the FET storage components referred to receive their input signals from the outputs of bipolar components, it is necessary to adapt the appertaining levels at such interfaces.

A voltage level scheme typical of circuits with bipolar transistors is the so-called TTL level scheme. For this purpose, it may be agreed, for example, that one binary state, e.g., logical "0", be represented by a voltage ranging from 0 to 0.6 V and the other binary state, e.g., logical "1", by a voltage value ranging from 2.4 to the operating voltage of, e.g., 5 V. In comparison with this, the control and operating voltages typical of FET circuits are noticeably higher. As a result, a field-effect transistor controlled in the worst case by an input signal of as little as 2.4 V for the upper binary state would be only relatively weakly conductive at a threshold voltage VT of about 1.5 V. In other words, a field-effect transistor thus controlled would still be relatively highly resistive even in its conductive state, so that a further circuit node, a load capacitance or the like could be discharged only comparatively slowly. For this reason, at the interfaces between bipolar and FET chips there were previously provided separate level converter chips in bipolar technology, the output voltages of which suited the specific input requirements of the FET components. However, in the course of further development the demand for fully TTL-compatible FET storage components has been increasing.

Input circuits comprising field-effect transistors and operated by means of input signals in the TTL level scheme are known, for example, from U.S. Pat. Nos. 3,739,194 and 4,063,119, as well as from the IEEE Journal of Solid-State Circuits, Vol. Sc-13, No. 3, June 1978, pp. 333 to 338, in particular FIG. 5 on page 335. The circuit situation described in these citations is such that the turn-on voltage (threshold voltage) of the input FET is lower than the voltage level of the input signal associated with the switch-off state. Thus, unless additional measures were taken, the input FET could not be reliably switched off by means of a TTL input signal. For the manufacture of the field-effect transistors it would rather be necessary to use a modified process ensuring that the field-effect transistors are designed for a higher threshold voltage (assuming, for example, that an N-channel enhancement FET is used). The input FET in accordance with the afore-mentioned citations is reliably switched off by raising its turn-on voltage above the switch-off level by means of a bias applied to the source electrode. However, such a rise disadvantageously affects the switch-on process of the input FET, so that, in accordance with the third citation, it can be reversed during the input signal phases.

SUMMARY OF THE INVENTION

In comparison with this, the invention proceeds from a different situation. It concerns input circuits with field-effect transistors, the threshold voltage of which is between the switch-on and the switch-off level of the TTL input signal, so that from this point of view, it is generally possible to switch the input FET on or off. The problem to be solved refers to the circuit situation described above, namely, that a field-effect transistor controlled at so low an overdrive relative to the threshold voltage has relatively long switching times and would still be relatively highly resistive even in its conductive state. As a result, a field-effect transistor thus controlled would discharge a further circuit node or the like correspondingly slowly.

For applications using input signals with full FET levels, a circuit made up of field-effect transistors, as described, for example, in German Offenlegungsschrift No. 22 43 671 of the applicant or in U.S. Pat. No. 3,710,271, has been found very advantageous with regard to high switching speeds and high output voltage levels. Such a circuit is an improved bootstrap driver stage, the bootstrap capacitor of which is provided in an unloaded similar inverter stage arranged parallel to the output inverter stage. It would be desirable, however, to use such a circuit, which is controlled by relatively low input signal levels (corresponding to those of TTL input signals), also as an input circuit for voltage level conversion into higher (FET) levels relative thereto.

Thus, it is generally the object of the invention to render such field-effect transistor input circuits compatible with relatively small input signals, e.g., TTL signals. The invention, as characterized in the patent claims, concerns measures for extending a FET circuit arrangement known per se in such a manner that improved driver characteristics, in particular high switching speeds, are obtained even for input signal levels which are relatively low (in comparison with FET levels), without having to tolerate an area increase of the input transistors. In summary, the respective potential difference effective between gate and source of the input transistors both in the conductive and the blocked state is increased relative to the respective potential of the input signal in such a manner that at the source of the input transistor(s) a potential shift is produced which is directed oppositely to the respective gate potential and which is set as a function of an input signal controlled auxiliary current branch in a manner still to be described in detail. Generally, the current switching principle is used for this purpose. In accordance with this principle, the current flowing in one switching state is switched in the other switching state to an adjacent auxiliary current branch, which necessitates only a relatively low additional auxiliary current for shifting the potential in the opposite direction and thus for increasing the effective potential difference between gate and source of the input FET. For input FETs controlled by a signal swing which is low in comparison to FET levels, this leads to considerably improved switching speeds, without considerably increasing the dimensions of the input FETs, which was previously indispensible.

DESCRIPTION OF THE DRAWING

The sole FIGURE is a schematic drawing of a level converting circuit which includes the circuit of the invention.

DESCRIPTION OF THE PREFERRED EMBODIMENT

One way of carrying out the invention will be described in detail below with reference to the drawing which illustrates one specific embodiment. It is assumed in this case that the transistors take the form of the usual N-channel MOS field-effect transistors of the enhancement type, the operating voltage VH of which is typically about +8.5 V and the threshold voltage of which is about 1.5 V. However, the invention can also be realized, using field-effect transistors of another type, e.g., of the other conductivity type, at a correspondingly modified operating voltage polarity.

As previously mentioned, the circuit part with the field-effect transistors 1 to 5, as shown in the FIGURE, is a circuit known per se. According to the known version, the circuit node designated as D would be connected to a fixed potential (ground). This circuit constitutes a so-called high-speed bootstrap driver stage, the bootstrap capacitor CB1 of which is provided in an unloaded similar inverter stage (transistors 1 and 3) arranged parallel to the output inverter stage (transistors 2 and 4). The gate electrodes of the two input FETs 1 and 2 are jointly connected to the signal input SE. The signal output SA is arranged at the connecting point designated as B between the input FET 2 and its load FET 4. The load effective at the output is indicated by CL. It is particularly significant that the output signal of this circuit reaches the full value of the operating voltage VH by the gate of the FET 4 being raised above the value VH by means of the bootstrap arrangement of 1, 3, 4, and CB1. Further details regarding the design and operation of this circuit can be omitted in this case, as they concern a known circuit. However, to supplement the foregoing information, explicit reference is made to the above-mentioned citations, German Offenlegungsschrift No. 22 43 671 and U.S. Pat. No. 3,710,271.

Controlling the previously described circuit by signal levels which are reduced over the full FET levels and which are typical, for example, of TTL circuit concepts, i.e., providing such a circuit as a TTL-FET level converter on FET chips, has the following disadvantages. In such a case the voltage (VGS−VT) effective between gate and source of the input transistors 1 and 2 is rather low. The typical up- and down-level limits, designated as LPUL=2.4 V and MPDL=0.6 V, respectively, to be considered for a TTL signal are shown in the drawing together with the threshold voltage VT=1.5 V. As at such low input signal levels the threshold voltage is exceeded only slightly or its value is only slightly less than that of the input signal, it is necessary in the interest of reasonable driver characteristics, in particular in the interest of reasonably short switching delays, to dimension the input transistors 1 and 2 correspondingly large. However, this inevitably leads to an increase of parasitic capacitances and thus to a loss in switching speed.

To solve these problems, the invention provides an extension of the above-mentioned circuit, as will be described below. Instead of connecting the common source point D of the input transistors 1 and 2 to a fixed potential, e.g., ground, D is connected in this case to a negative voltage source Vsub via a resistive element R. For this purpose, R is advantageously designed as a diffused resistor which can be integrated together with the remaining circuit elements. Vsub is a voltage source whose potential is below the switch-off level of the input signal and which is preferably formed by the substrate voltage source to be provided for the field-effect transistors anyhow. The common source point D is also connected to a voltage source VL via a FET 6, thus forming an auxiliary current branch for an auxiliary current IH flowing into the node D. Instead of being connected to a voltage source VL, whose voltage is less than VH, the transistor 6 can also be connected to VH. However, the choice of an auxiliary voltage source VL with a lower voltage permits a reduction in power dissipation.

The gate electrode of the transistor 6 is connected as a conventional source-follower amplifier to the output of a bootstrap inverter stage with the transistors 7, 8 and 9, as well as to the bootstrap capacitance CB2. The circuit used for this bootstrap inverter stage is a conventional partial circuit. The gate electrode of the transistor 7 and the gate electrodes of the transistors 1 and 2 are jointly connected to the circuit input SE for the TTL input signal so that the output voltage of the inverter at the gate electrode of transistor 6 is out-of-phase with the TTL input signal at signal input SE.

For illustrating the operation of the complete circuit it is assumed that the TTL input signal represents a selection signal, the up-level being present at the input SE in the unselected state and the input transistors 1 and 2 being conductive. As a result, the output SA is kept at down-level. For this purpose, the circuit is dimensioned in such a manner that in the unselected state the source connecting point D is connected to a negative potential of, for example, −0.7 V. Because of this, the effective gate source voltage available for the input transistors 1 and 2 is higher than in those case where only the TTL input signal is applied to the gate electrodes and the source connecting point D is at ground. The higher effective control voltage permits dimensioning the input transistors 1 and 2 considerably smaller than was previously possible. Transistor 7 is conductive at that stage, pulling the potential at the gate electrode of the transistor 6 downwards, so that transistor 6 is blocked. Thus, the current ID flowing from the source connecting point D, via R, to the voltage source Vsub is formed by the sum of the currents I1 and I2 through the input transistors 1 and 2, since the blocked transistor 6 prevents the auxiliary current IH from flowing.

Upon transition to the selected state, the input signal assumes its down-level. In this case transistor 7 is blocked immediately, so that (supported by the bootstrap operation) the potential at the gate of transistor 6 is rapidly increased. Through transistor 6 which is conductive at that time, the auxiliary current IH is able to flow to the source connecting point D, thus increasing its potential to, for example, +0.7 V. As a result of the drop in the gate potential of the input transistors 1 and 2 which occurs simultaneously therewith, the latter are switched off at an extremely high speed, so that the potential of the circuit node A very rapidly increases towards the operating voltage VH, permitting node C to be raised beyond VH (bootstrapping). As a result of the fast switching process, an undesirable overlapping current in the selected state in transistor 2 is prevented when the potential at output node B increases. The potential at node D, which is the steady state increases to about +0.7 V, reliably blocks the transistors 1 and 2 in the selected state. With regard to the currents, the following applies: ID is represented by IH and is slightly higher than the sum of I1 and I2 in the unselected state, so that the voltage drop across R is larger in the selected state than in the unselected state.

When the circuit is again switched to the unselected state, i.e., when the input signal changes from the down- to the up-level, the gate of the FET 6 is discharged via the field-effect transistor 7. The additional current flow IH into the source connecting point decreases, which means that the voltage at D decreases likewise. As a result, the input transistors 1 and 2 are switched on extremely rapidly, so that a load CL effective at the output is discharged correspondingly rapidly.

These measures taken in connection with the known circuit lead to a TTL to FET level conversion circuit made up of field-effect transistors, which has considerably improved characteristics. It has been found that at comparable load conditions a switching time reduced by half is obtained. It is pointed out that these measures are not necessarily limited to a bootstrap driver stage of the kind assumed for the embodiment. As described above, the significant fact is that the source potential proceeds oppositely to the input signal. The potential is lowered or raised by current switching from the input transistor(s) to an auxiliary current branch coupled with the source connecting point. The use of the current switching principle leads to a reduction in the voltage variations on the supply lines, which are caused by load variations.

The main advantages obtainable by means of the invention are that the input FETs 1 and 2 can be dimensioned considerably smaller, which in addition to area savings in the integrated structure, leads to reduced parasitic capacitances which otherwise would negatively affect the switching speed. The positive feedback via the source connecting point D leads to a reduction in the requirements of the rise/fall times of the input signal, thus considerably reducing the switching delay. The increase in the effective control voltage also leads to a considerable increase in the noise immunity of such a converter circuit. Finally, if the improved speed made possible by the invention are not required, the circuit of the invention can be designed to operate at the same switching delays as the known circuit and to dissipate less power.

What is claimed is:

1. A field-effect transistor input buffer circuit for converting low level binary logic input signals applied to an input node to high level binary logic output signals delivered to an output node, the input signals having predefined up and down logic levels, each of the up and down levels being defined over a range of voltages, comprising:

a source bias node;

a first field-effect transistor having gate, drain and source electrodes, the gate electrode being connected to the input node, the drain electrode being connected to the output node and the source electrode being connected to said source bias node, and source bias control means responsive to signals on the input node for changing the potential on said source bias node to increase the gate-to-source voltage of said first transistor to a voltage greater than the voltage of an up level input signal in response to an up level input signal and to decrease the gate-to-source voltage of said first transistor to a voltage less than the voltage of a down level input signal in response to a down level input signal.

2. The input buffer circuit of claim 1 wherein said source bias control means comprises a resistive element connected between said source bias node and a voltage source having a potential which is less than the voltage level of a down level input signal.

3. The input buffer circuit of claim 2 wherein said voltage source is a substrate bias voltage for said first field effect transistor.

4. The input buffer of claim 3 wherein said resistive element is a semiconductor resistor.

5. The input buffer of claim 1 wherein said source bias control means comprises a second field effect transistor connected between said source bias node and a voltage source having a potential greater than the voltage level of an up level input signals, said second field-effect transistor being responsive to a signal out-of-phase with the input signal.

6. The input buffer circuit of claim 5 wherein said source bias control means includes a field-effect transistor inverter circuit including a third field-effect transistor having its gate electrode connected to the input node.

7. The input buffer circuit of claim 1 wherein said source bias control means comprises a field-effect transistor bootstrap inverter circuit driver responsive to the input signal and having its output coupled to a source-follower coupled field-effect amplifier, the output of which is connected to said bias node.

8. The input buffer circuit of claim 7 further including a second field-effect transistor having its gate electrode connected to the input node, its source electrode connected to said source bias node and its drain connected to the source of a third field-effect transistor, a bootstrap capacitor coupled between the gate and source electrodes of the third transistor and a fourth field-effect transistor having its source connected to the output node, the gates of the third and fourth transistors being common and the drain electrodes of the third and fourth transistors connected to a field-effect transistor power supply source.

* * * * *